United States Patent
Emoto (10) Patent No.: US 7,557,469 B2
(45) Date of Patent: Jul. 7, 2009

(54) POSITIONING SYSTEM AND LINEAR MOTOR

(75) Inventor: Keiji Emoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 444 days.

(21) Appl. No.: 11/392,601

(22) Filed: Mar. 30, 2006

(65) Prior Publication Data

US 2006/0220478 A1    Oct. 5, 2006

(30) Foreign Application Priority Data

Apr. 1, 2005  (JP)  ............... 2005-105829

(51) Int. Cl.
*H02K 41/00* (2006.01)

(52) U.S. Cl. ........................................ 310/12

(58) Field of Classification Search ............ 310/12, 310/52, 64
See application file for complete search history.

(56) References Cited

U.S. PATENT DOCUMENTS

| | | | |
|---|---|---|---|
| 6,084,319 A | 7/2000 | Kamata et al. | 310/12 |
| 6,226,073 B1 | 5/2001 | Emoto | 355/53 |
| 6,810,298 B2 | 10/2004 | Emoto | 700/121 |
| 6,915,179 B2 | 7/2005 | Emoto | 700/121 |
| 6,954,258 B2 | 10/2005 | Emoto | 355/72 |
| 6,987,335 B2 | 1/2006 | Korenaga | 310/12 |
| 7,038,759 B2 | 5/2006 | Emoto et al. | 355/30 |
| 7,053,982 B2 | 5/2006 | Emoto | 355/53 |
| 7,288,864 B2 * | 10/2007 | Eaton et al. | 310/53 |
| 2005/0030347 A1* | 2/2005 | Zarev | 347/61 |
| 2005/0040712 A1* | 2/2005 | Hazelton | 310/12 |
| 2005/0092013 A1 | 5/2005 | Emoto | 62/304 |
| 2005/0132962 A1 | 6/2005 | Emoto | 118/729 |
| 2005/0212361 A1 | 9/2005 | Emoto | 310/12 |
| 2005/0248219 A1 | 11/2005 | Korenaga | 310/12 |
| 2005/0253463 A1 | 11/2005 | Emoto | 310/12 |
| 2006/0220478 A1 | 10/2006 | Emoto | 310/58 |

FOREIGN PATENT DOCUMENTS

| | | |
|---|---|---|
| JP | 2994203 | 10/1999 |
| JP | 2000-32733 | 1/2000 |
| JP | 2000-114034 | 4/2000 |
| JP | 3278380 | 2/2002 |
| JP | 2004-254489 | 9/2004 |

* cited by examiner

*Primary Examiner*—Hanh N Nguyen (74) *Attorney, Agent, or Firm*—Fitzpatrick, Cella, Harper & Scinto (57) ABSTRACT

A positioning system includes a stage configured to move while carrying an object thereon, an interferometer configured to measure a position of the stage, a driving unit configured to drive the stage, a heater provided between a light path of the interferometer and a coil which is a component element of the driving unit, and a cooling jacket configured to cover the coil and to circulate a cooling medium therein. The heater is provided on a surface of the cooling jacket.

12 Claims, 9 Drawing Sheets

PRIOR ART

FIG.8

PRIOR ART

FIG.9

PRIOR ART

POSITIONING SYSTEM AND LINEAR MOTOR

This application claims priority from Japanese Patent Application No. 2005-105829 filed Apr. 1, 2005, which is hereby incorporated by reference.

FIELD OF THE INVENTION AND RELATED ART

This invention relates to a precision positioning system, such as an X-Y table, to be used in a semiconductor exposure apparatus, a surface shape measuring apparatus or a high-precision machining apparatus, for example, or to a linear motor suitably usable in such a positioning system. More specifically, in one aspect, the invention concerns a temperature controlling structure in such a positioning system, for avoiding or reducing adverse influence of heat generated from a driving system for moving an article to be positioned, upon an interferometric gauge.

Recent exposure apparatuses use a linear motor as a driving source for a reticle stage, a wafer stage, and so on. From the standpoint of the principle employed, these linear motors may be categorized into a Lorentz type, a pulse motor type, an induction type, and so on. Anyway, the term "linear motor" generally refers to a driving source configured to directly apply a straight motion (reciprocal motion) to an article on the basis of an electromagnetic force. Recently, in place of using a combination of plural linear motors having straight motions to provide a plane (two-dimensional or three-dimensional) motion, a "plane motor" in which the plane motion can be achieved by use of a single motor is being developed.

Anyway, since the linear motors are one of electromagnetic actuators, when an electrical current is applied to a coil to produce a driving force, in response to it, heat corresponding to the internal resistance of the coil is generated there. This causes a temperature rise around the coil, which in turn causes a change in temperature of structural components around the coil and, then, deformation of them due to thermal expansion. If these components include members related to a positioning reference, such as a linear scale of an encoder or a reflection mirror of an interferometric gauge, these changes may directly result in the positioning precision.

Furthermore, when an interferometric gauge, such as a laser interferometer, is used to measure the position of an article which is going to be positioned, any temperature unevenness around the interferometer optical axis (measurement light path) due to heat generating members, such as described above, will cause fluctuation of air around the laser light path, resulting in a position measurement error. If it is attributable to thermal deformation of a structural member, such a measurement error might be predicted to some extent and, since the change itself will be slow, the measurement error could be compensated for relatively easily. Since, however, the measurement error of laser interferometers attributable to fluctuation of air is variable quickly, as compared with thermal deformation, prediction is very difficult to achieve. Practical compensation techniques therefor have not been established, for this reason. Currently, in consideration of this, the space design is carried out very carefully, particularly so as to avoid generation of fluctuation of air around the laser interferometer optical axis. Hence, in addition to the air-conditioning design, reducing temperature unevenness due to heat generating members is a very critical issue.

Figure 7:
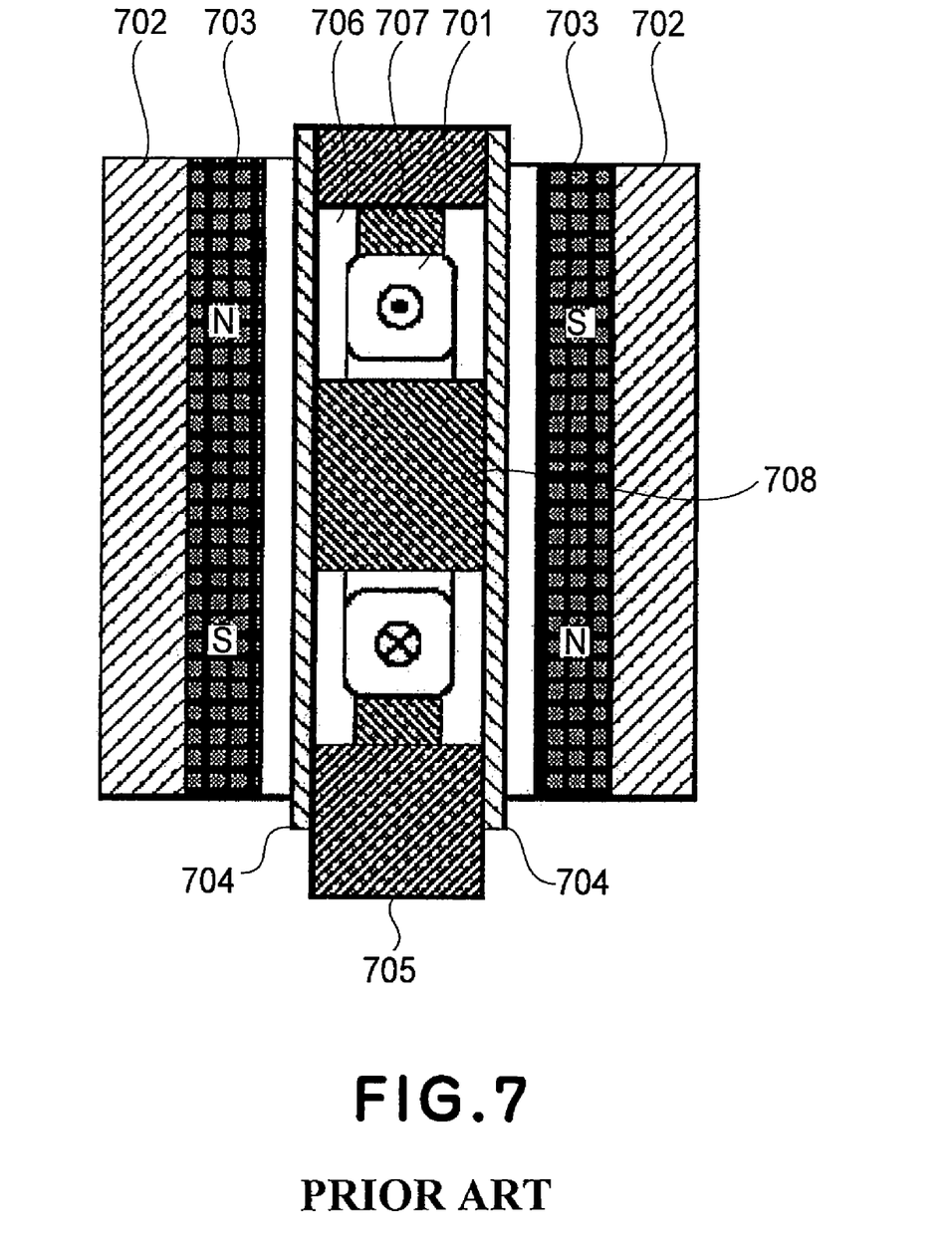
FIG. 7 is a sectional view of a linear motor structure having a coil cooling structure of a known type.

Generally, in view of these matters, a linear motor used in an exposure apparatus has a structure, such as shown in FIG. 7, wherein a coil 701 in which a heat generating member in the linear motor is covered by jackets 704 and 705, and wherein a cooling medium, such as an inactive coolant or pure water, flows through a clearance between the coil 701 and the jackets 704 and 705 to collect heat generated from the coil 701 (see, for example, Japanese Patent No. 3278380). With this arrangement, the surfaces of the jackets covering the coil are temperature-adjusted. As a result, heat is not transferred to structural members about the motor on one hand, and temperature unevenness of the jacket surface is reduced on the other hand. Therefore, even if the linear motor is disposed adjacent to the light path of an interferometer, fluctuation of air can be suppressed.

In FIG. 7, denoted at 702 are two yokes that constitute a magnetic circuit, and denoted at 703 are permanent magnets, which are fixed to the yokes 702, respectively, and which are mounted so that different magnetic poles are disposed opposed to each other. Denoted at 704 are sheet members disposed to sandwich the coil 701 therebetween, and denoted at 705 is a frame for supporting the two sheet members 704. The sheet members 704 and the frame 705 constitute a jacket structure for covering the coil 701. The sheet members 704 and the frame 705 are fixedly connected together by means of an adhesive agent or bolts. Denoted at 706 is an inside space defined in the jacket structure, and denoted at 707 is a fixing member for fixing the coil 701 to the jacket structure. Denoted at 708 is a reinforcing member.

However, further improvements in exposure precision, namely, stage positioning precision are desired strongly and, therefore, the measurement error of the laser interferometer has to be reduced much more. Particularly, a measurement error attributable to fluctuation of air, which is difficult to be compensated for, must be suppressed much more. In this sense, the requirement for temperature adjustment precision in regard to the surface temperature of structural members around the optical axis of the interferometer is very high. Namely, in a conventional system in which heat from a heat generating member is collected by means of a circulating cooling medium, even if the temperature of the cooling medium flowing into the jacket is controlled precisely, since the temperature of the cooling medium changes in response to transfer of heat thereto from the heat generating member, the temperature of the cooling medium flowing outwardly from the jacket necessarily becomes higher than the temperature of the medium as the same was injected into the jacket. This means that, although at the upstream side, within the jacket the cooling medium, temperature can be adjusted in accordance with the air temperature around the optical axis, as the medium flows toward the downstream side, the temperature thereof inevitably becomes higher than the air temperature.

Furthermore, since the heat generation from the coil is changeable with the state of driving, the temperature of the cooling medium at the downstream side, that is, the jacket surface temperature at the downstream side of the flow is also variable together with it. In order to suppress fluctuation of air as much as possible, a proposal has been made to measure the temperature around the jacket and to change the flow rate of cooling medium appropriately (see, for example, Japanese Patent No. 2994203). However, generation of uneven temperature between the upstream side and downstream side of the jacket is inevitable in principle, and there is a limit to suppression of the fluctuation of air.

Figure 8:
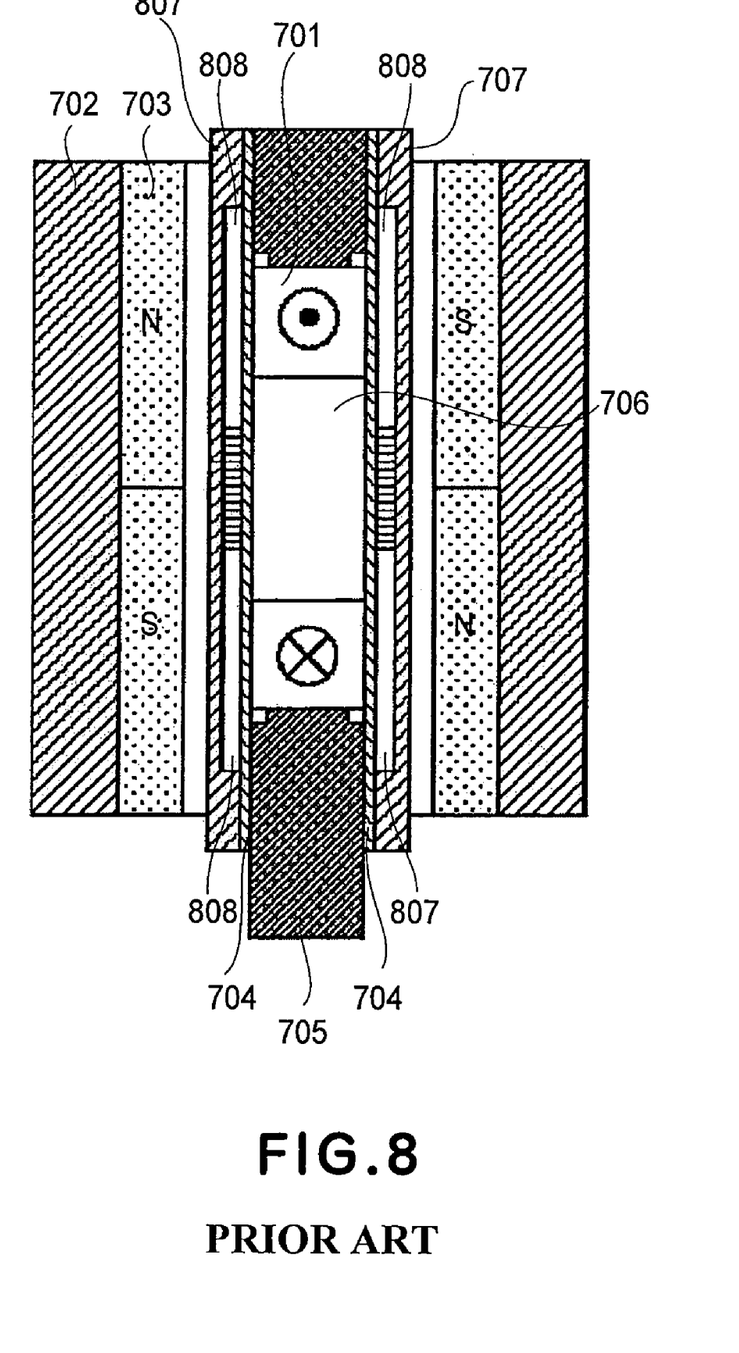
FIG. 8 is a sectional view of a known type structure for suppressing a temperature rise of the surface of a linear motor.
Figure 9:
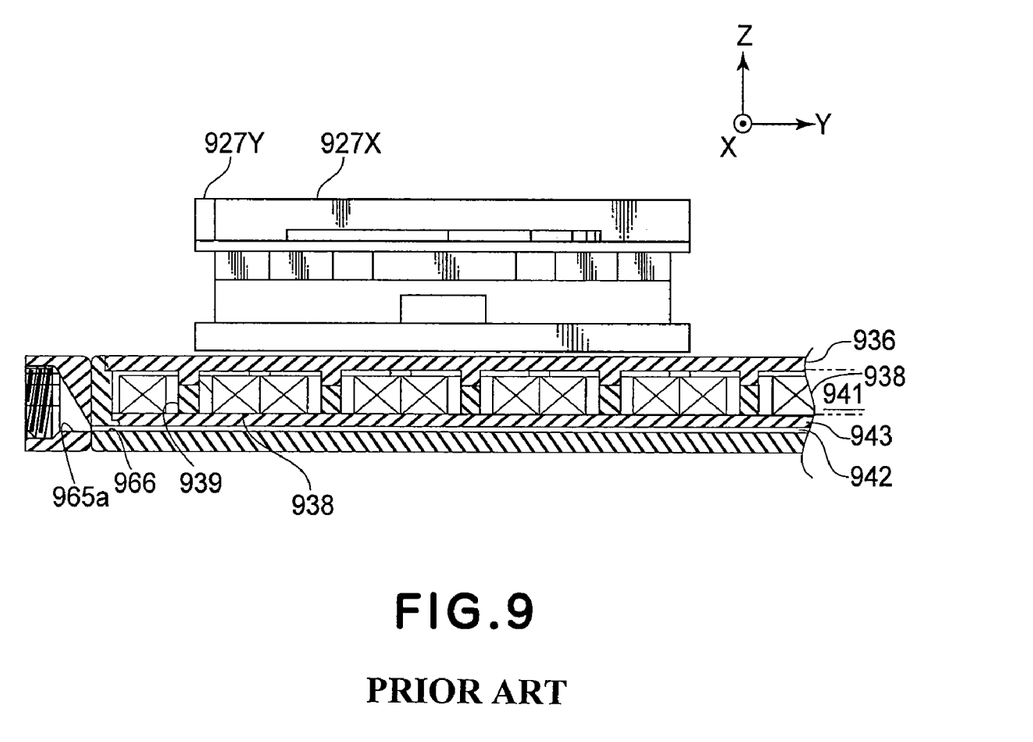
FIG. 9 is a sectional view of a known type structure for suppressing a temperature rise of the surface of a stator of a plane motor.

In consideration of this, a proposal has been made to add a heat insulating function to a linear motor having a jacket structure such as described hereinbefore (see, for example, Japanese Laid-Open Patent Applications, Publication No. 2000-114034 and No. 2000-032733). FIG. 8 shows the structure of a single-axis linear motor proposed in Japanese Laid- Open Patent Application, Publication No. 2000-114034. FIG. 9 shows the structure of a plane motor proposed in Japanese Laid-Open Patent Application, Publication No. 2000-032733.

In FIG. 8, a flowpassage 808 is added outside the linear motor jacket structure shown in Japanese Patent No. 3278380, and a separate temperature-controlling cooling medium flows therethrough so as to avoid temperature unevenness on the surface of the jacket (704, 705 and 807). Namely, a dual-jacket structure is used to ensure that any temperature difference between the upstream side and the downstream side of the cooling medium flowing through an inner flowpassage 706 as caused by collection of heat from the coil 701 is prevented from being transferred to the jacket surface by removing the temperature unevenness with the use of the cooling medium that flows through an outer flowpassage 808.

FIG. 9 shows an example wherein a jacket structure is applied to a plane motor. In this example, heat, which is generated by a coil 938, is collected by a cooling medium that flows through a flowpassage (965a, 966 and 942), to cause temperature unevenness between the upstream side and the downstream side of the medium flow. Here, a vacuum heat insulating chamber 941 is provided to prevent transfer of this temperature unevenness to that surface of the linear motor jacket which faces the optical axis of an interferometer and which has reflection mirrors 927X and 927Y formed thereon. With this arrangement and due to a vacuum heat insulation effect, heat transfer from the coil 938 to the jacket surface is suppressed extremely, as compared with the linear motor structure, as disclosed in Japanese Patent No. 3278380, and unevenness of jacket surface temperature is reduced thereby.

In the structure shown in FIG. 8, however, because of the addition of the outer flowpassage 808, the interspace between the magnet 703 and the coil 701 becomes considerably large as compared with the structure shown in FIG. 7. This means that the magnetic gap becomes very large, and thus, the efficiency of the linear motor becomes slow. Namely, to obtain the same thrust, a larger structure is required as compared with the structure of FIG. 7, and larger heat generation results therefrom. Furthermore, with the structure shown in FIG. 9, although heat transfer from the coil 938 to the jacket surface member 936 can be suppressed due to the vacuum heat insulation effect, it is possible that heat generated at the coil 938 is transferred to the jacket surface member 936 through a coil supporting member 943 or a deformation preventing member 939, to raise the coil temperature. On that occasion, inside the jacket surface member 936, only the temperature around the deformation preventing member 939 will be raised.

The deformation preventing member 939 might be omitted or made much smaller by thickening the jacket surface member 936 to keep the rigidity. On that occasion, however, the interspace between the magnet (not shown) and the coil becomes large, and the linear motor efficiency becomes quite slow.

Although conventional structures for reducing temperature unevenness on the linear motor jacket surface as disclosed in some patent documents have been described hereinbefore, all of these structures involve inconveniences, such as limitations in regard to temperature precision, the need of a very complicated structure, or sacrificing the linear motor efficiency. Hence, these arrangements are not desirable.

SUMMARY OF THE INVENTION

It is accordingly an object of the present invention to provide a temperature controlling system of a simple structure, by which any temperature unevenness on the surface of a linear motor can be reduced effectively such that fluctuation of air that is adversely influential to measurement through a laser interferometer can be minimized.

In accordance with an aspect of the present invention, there is provided a positioning system, comprising:

a stage being movable and being configured to carry an object thereon;

an interferometer configured to measure a position of the stage;

driving means configured to drive the stage; and a heater provided between a light path of the interferometer and a coil, which is a component element of the driving means.

In one preferred form of this aspect of the present invention, the heater has a film-like shape.

The advantageous effects of the present invention will be more outstanding when the heater is provided on a surface of a cooling jacket, which surface is approximately opposed at least to an optical axis (measurement light path) of an interferometric gauge. The heater may preferably comprise a film-like heater, from the standpoint of uniformness of the surface temperature. The heater may be adhered to the cooling jacket through a resin material or a vacuum insulating material, and on that occasion, transfer of heat generated by the heater to the cooling medium can be reduced, with a result of more efficient temperature control.

The temperature of the cooling medium may be set at a level lower than the temperature of air around the optical axis of the interferometric gauge. On that occasion, even if the amount of heat generation of the coil changes, by controlling the heat generation of the coil, the surface temperature of the cooling jacket can be adjusted to the level of the air temperature around the optical axis.

A plurality of heaters may be provided along the surface of the cooling jacket, and they may be arranged so that the amount of heat generation of each heater can be controlled independently of the others, in accordance with the temperature distribution of the cooling jacket. As a result, the temperature distribution on the cooling jacket surface can be reduced effectively.

A temperature measuring device for measuring the temperature of the surface, or around it, of the cooling medium, which surface is approximately opposed at least to the optical axis of an interferometric gauge may be provided to control the amount of heat generation of the heater on the basis of an output of the temperature measuring device. On that occasion, the temperature of the cooling jacket can be adjusted to be constant with respect to a set temperature.

In that case, at least a portion of the cooling jacket may be disposed between a stator and a movable element of the linear motor. Particularly, the heater may preferably be provided on the surface of the jacket, which surface faces the measurement light path of the interferometric gauge. Alternatively, the heater may be disposed on the surface of the stator or the movable element of the linear motor or, as a further alternative, it may be disposed between a coil and a magnet of the linear motor. As regards the heater, at least the surface of the jacket may be made of an electrically conductive material, such that the conductive material may function as the heater when an electrical voltage is applied thereto.

In the present invention, a control system may preferably comprise a drive control system for controlling drive of the linear motor, and a computing system for predicting a temperature change of the temperature adjusting member on the basis of an output of the drive control system, such that the amount of heat generation of the heat generating member can be controlled on the basis of an output of the computing system. With this structure, the heater can be feed-forward controlled, and the response time can be improved. Furthermore, without a temperature sensor, the surface temperature of the cooling jacket can be controlled to some extent. Moreover, the present invention can provide greater advantageous effects when the same is applied to a plane motor.

The jacket may be made of a resin material or a vacuum insulation material.

In accordance with the present invention, with a quite simple structure that a temperature adjusting member and a heat generating member are disposed between a heat generating portion and an interferometer optical axis, uneven temperature of the measurement light path of the interferometer can be reduced, and fluctuation of adversely influential to the measurement by the interferometer can be minimized. Hence, very high precision positioning operation is assured.

Particularly, in a case wherein the heat generating portion is a coil of a linear motor having a function for moving an object to be positioned, and the coil is cooled by a cooling medium flowing through the inside of a jacket that surrounds the coil, a plane-like heater having a film-like shape may be adhered to the surface of the jacket to adjust the temperature of that surface. On that occasion, without decreasing the efficiency of the motor, fluctuation of air along the light path of an interferometer disposed nearby can be reduced much more. Hence, a position measurement error can be reduced and the positioning precision can be improved significantly.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
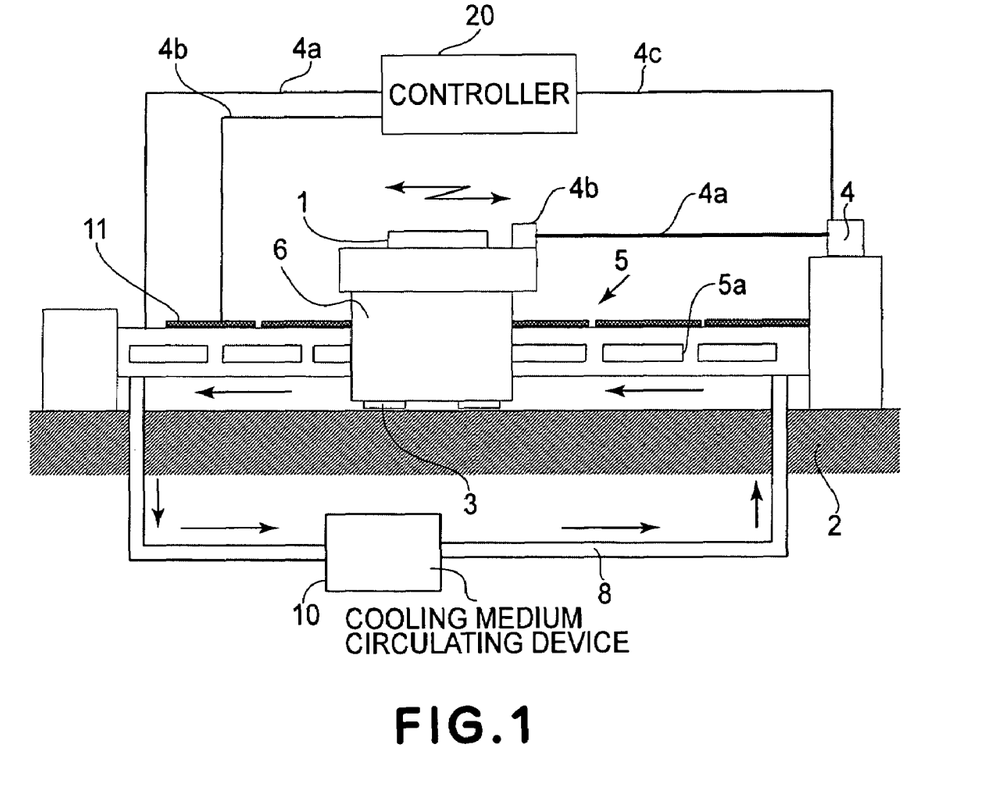
FIG. 1 is a schematic view of a general structure of a positioning system according to a first embodiment of the present invention.

A first embodiment of the present invention will be explained with reference to FIG. 1. FIG. 1 shows a linear motor and a positioning system having an interferometric gauge for position measurement. In this embodiment, the invention is applied to a positioning system in which the position of an object to be positioned is measured by use of a laser interferometer, wherein the positioning system includes a heat generating portion and a temperature adjusting member, having a cooling system for collecting heat generated from the heat generating portion by use of a cooling medium. The temperature adjusting member is disposed adjacent to the optical axis of the laser interferometer, and the heat generating portion is provided to the surface of the temperature adjusting member.

In FIG. 1, the object 1, which is going to be positioned, is floated with respect to a base table 2 by means of a static bearing 3 on one hand, and it is guided by the base table 2 on the other hand, such that the object 1 can be moved leftwardly and rightwardly as seen in the drawing. On the basis of an output of an interferometer 4, an appropriate electrical voltage is applied to coils 5a inside a stator 5 of a linear motor, by which the object 1 to be positioned can be moved to a predetermined position. There is a temperature controlling cooling-medium circulating system 10 for collecting heat generated by the coils 5a, by which a cooling medium 8 maintained at a predetermined set temperature is circulated to contact the coils 5 directly or through a heat transfer member (not shown). Here, the set temperature is the same temperature as that of the temperature of air around the object 1 to be positioned, or a temperature lower than it. The cooling medium may be pure water or an inactive cooling medium, for example.

Figure 2:
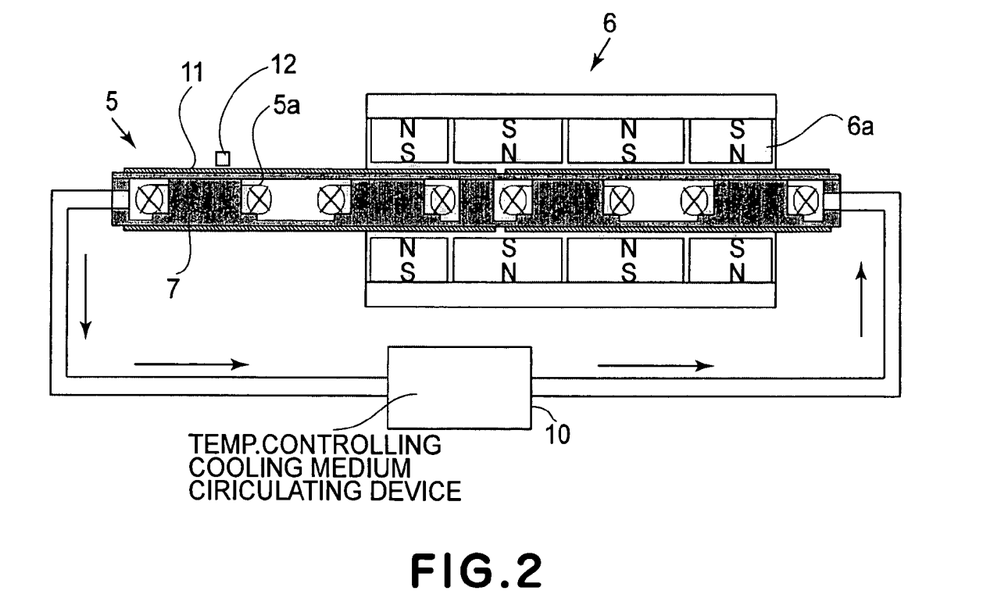
FIG. 2 is an enlarged view for explaining details of the structure of a linear motor shown in FIG. 1.

FIG. 2 illustrates details of the structure of the linear motor. The movable element denoted at 6 comprises a plurality of magnets 6a, which are arrayed appropriately to produce a magnetic circuit. On the other hand, the stator denoted at 5 has a structure for fixedly positioning the coils 5a in accordance with the magnetic circuit, and it has a jacket 7 that covers all the coils 5a. In other words, the coils 5a are positioned and fixed inside a closed container. In the sheet of the drawing of FIG. 2, the cooling medium 8 enters the jacket 7 from its right-hand end and, while the cooling medium 8 flows inside the jacket 7, the cooling medium 8 directly contacts the coils 5a and collects heat from the coils 5a. After that, the cooling medium 8 flows outwardly from the left-hand end of the jacket 7 and it enters a temperature controlling cooling-medium circulating system 10 in which the cooling medium temperature, being raised by the heat collection, is lowered back to the set temperature. Then, the cooling medium is re-circulated.

It should be noted here that, although the heat of the coils 5a itself can be treated by means of the cooling medium 8 and by the temperature controlling system in a portion without thermal influence, as regards the cooling medium 8, since it has a property that the temperature thereof rises in response to collection of heat from the coils 5a, as a matter of course, there occurs a temperature difference between the upstream side of the medium (cooling medium entrance port at the right-hand side as viewed in the drawing) and the downstream side of the medium (cooling medium exit port at the left-hand side as viewed in the drawing). As a matter of course, such a temperature rise of the cooling medium 8 can be lowered by increasing the flow rate of the cooling medium. However, increasing the flow rate of the cooling medium necessarily results in an increase of the pressure loss. It means that a higher pressure-withstanding strength is required for the jacket 7. Furthermore, the flow of the cooling medium 8 may cause vibration, which is adversely influential to the positioning system as a whole. Hence, increasing the flow rate of the cooling medium is not unrestricted.

If there is a temperature difference between the jacket 7 surface and the air around the same, very small fluctuation of the air will be produced to cause a local density gradient of the air. The position measurement with the interferometer 4 is based on measurement of an optical distance, that is, measurement of the product of a real distance and the refractive index on the light path 4a. Therefore, even a local change in the air density (namely, a change in refractive index) along the light path 4a is equivalent to a change in the distance measured. If the optical axis (measurement light path) of the interferometer 4 is placed near the surface of the jacket 7, as in the case of FIG. 1, although there will be approximately no temperature difference between the jacket surface and the air around it at the upstream side of the flow (right-hand side in the drawing), a temperature difference will be produced gradually as the medium flows toward the downstream side (left-hand side in the drawing). Namely, fluctuation of air will be produced along the interferometer light path 4a.

In practice, if the object 1 to be positioned is driven to the right and to the left frequently, and there is fluctuation of air even in a limited portion along the movement path, the fluctuation of air will be disturbed by the motion of the movable element 6. Hence, the whole light path 4a may be influenced thereby to cause a large measurement error.

In consideration of this, in accordance with this embodiment of the present invention, the inconveniences of inevitable temperature differences between the upstream side and downstream side of the cooling medium 8 described above are met by the provision of a film heater 11 adhered to the surface of the jacket. Specifically, a planar heat generating member of a film-like shape having a thin thickness is adhered to the surface of the jacket 7, more particularly, in a few surface regions divided from the upstream side to the downstream side along the flowpassage of the cooling medium 8. Ordinary film heaters have a thickness of about 1 mm or less and, for some limited uses, those having a thickness of 0.2 mm or less are commercially available. The small thickness of film heaters is fully used in this embodiment.

This will be explained in greater detail. From the standpoint of design, the magnet surface and the coil surface should desirably be disposed as close to each other as possible, for improved motor efficiency in accordance with the principle of linear motors. On the other hand, from the standpoint of heat design, aiming at suppressing changes in surface temperature of the jacket, a heat insulating member should desirably be interposed between the magnet and the coil. Conventionally, when the position is measured by use of a laser interferometer, the measurement precision is the first priority and a vacuum heat insulating layer or a dual-jacket structure is used at the sacrifice of linear motor efficiency, as has been described in the introductory part of this specification. The interspace between the magnet 6a and the coil 5a is inherently about 1-2 mm. In order to provide a heat insulating material there, the interspace should be enlarged by 2 mm or more. Namely, an interspace of about 3-5 mm should be defined between them.

As compared with it, in the film heater structure according to this embodiment of the present invention, in ordinary designs, a film heater of about 0.5 mm thickness may be chosen. Thus, only with the addition of a thickness of 0.2 mm or less, the surface temperature of the jacket 7 can be controlled essentially in the same manner as the case wherein a heat insulating material is provided there. Therefore, a magnetic gap (interspace between the magnet and the coil) approximately the same as that of the structure before a heat insulating material is added, can be retained. Hence, a structure without decreasing the linear motor efficiency is accomplished.

In this embodiment, the cooling medium 8 to be circulated may be set at a temperature lower than the temperature of air around it. More specifically, it may preferably be set at a lower temperature that can provide a temperature difference larger than a possible largest temperature difference between the upstream side and downstream side of the flow of the cooling medium 8 inside the jacket 7.

Normally, the cooling medium 8 having a low set temperature flows, and the surface temperature of the film heater 11 is adjusted to the air temperature around it by applying an electrical voltage to the heater 11. If the temperature of the jacket 7 rises due to the drive of the linear motor, the amount of heat generation of the heater 11 is lowered to adjust the temperature. Since the heater region is divided into a few zones in the direction from the upstream side to the downstream side, by adjusting the temperatures of these heater elements independently of each other, the temperature unevenness with respect to the upstream-to-downstream direction can be reduced considerably.

Here, in order to minimize transfer of heat from the heater 11 to the cooling medium 8 that cools the coils 5a, the heater 11 should preferably be adhered with respect to the cooling medium by way of a heat insulating material. More particularly, the jacket 7 should desirably be made of a material having low heat conductivity (i.e., a heat insulating material), such as a resin, for example. As regards the control of the heater 11, the heater may be controlled on the basis of an output of a temperature sensor 12, in registration with the air temperature along the optical axis 4a. Alternatively, the surface temperature of the jacket may be predicted on the basis of coil heat generation information supplied from a controller 20 for driving the linear motor, and the amount of voltage application to the heater may be controlled on the basis of the prediction. Furthermore, the former method and the latter method may be used in combination, with a result of further improved temperature controlling precision.

In FIG. 1, denoted at 4b is a position reference for the position measurement (distance measurement) through the interferometer 4, and denoted at 4c is a measurement signal from the interferometer 4. Denoted at 20a is a linear-motor driving electrical current, and denoted at 20b is a film-heater driving electrical current.

As described above, the film heater 11 is adhered to the surface of the jacket 7 that surrounds the coils 5a of the linear motor (5, 6) and the amount of heat generation thereof is controlled. With this arrangement, fluctuation of air around the optical axis 4a of the interferometer 4 is reduced considerably, and the measurement precision is improved significantly. As a result, the positioning precision for the object 1 to be positioned is improved notably.

It should be noted here that, in place of using a film heater 11, an electrically conductive film may be formed at the surface of the jacket 7 and the conductive film may be used as a heat generating member.

Embodiment 2

Figure 3:
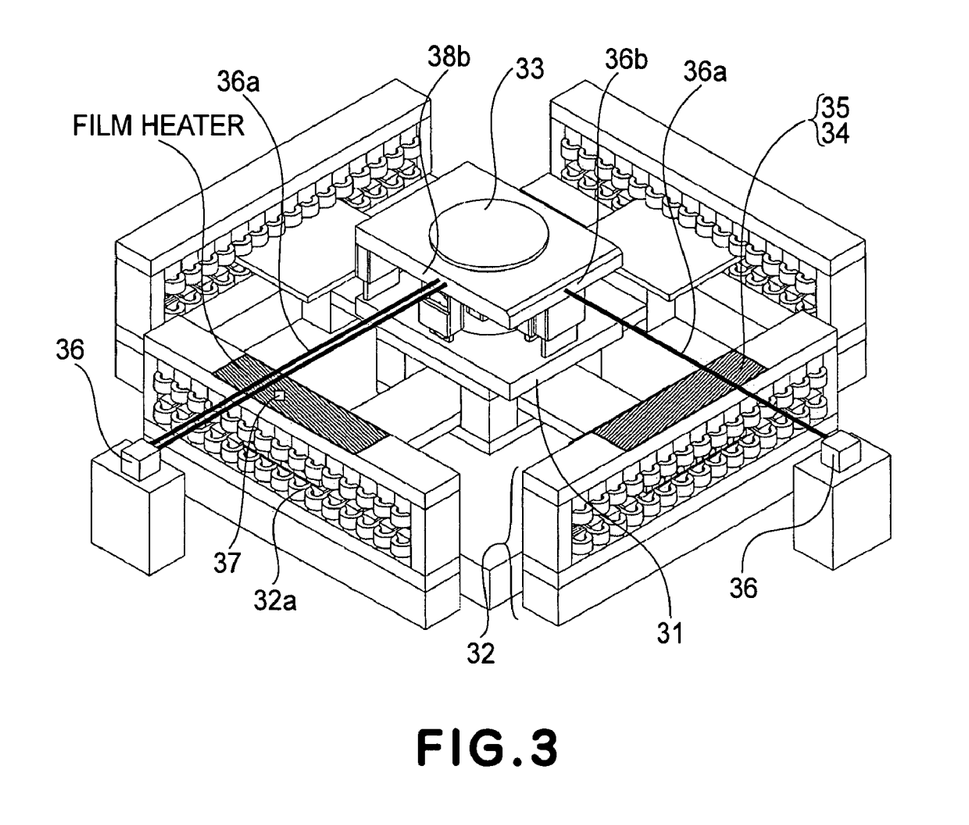
FIG. 3 is a perspective view of a general structure of a positioning system according to a second embodiment of the present invention.

A second embodiment of the present invention will be described with reference to FIG. 3. FIG. 3 shows a wafer positioning system having a dual-axis drive rough-motion stage and a six-axis drive fine-motion stage mounted on the rough-motion stage. The dual-axis rough-motion stage denoted at 31 is driven in X and Y directions by means of four linear motors 32, two for the X axis and two for the Y axis. As a notable feature of this structure, the object to be positioned is surrounded by the four linear motors, as shown in the drawing.

Generally, a rough-motion linear motor is the largest heat generating source in the positioning system and, in the case of FIG. 3, it is the four linear motors surrounding the object to be positioned. In the structure of this example, the heat source is preferably disposed far from a wafer 33, which is the object to be positioned and which should be kept away from the influence of heat. However, in relation to the position measurement using an interferometer 36, inevitably, the measurement light path 36a of the interferometer has to extend through the above of linear motors 32, which are a large heat source.

Conventionally, coil-generated heat of a linear motor (32) is collected by circulating a cooling medium and by means of a heat insulating member, such as a vacuum heat insulating material, adhered to the surface facing the light path (36a). However, although the restriction to the thickness of the heat insulating material is small, as in the first embodiment, it is still possible that the interspace between the surface of the linear motor 32 and the optical axis 36a of the measurement light path becomes as close as 5-10 mm. On that occasion, the surface temperature has more influence upon the measurement error. Hence, there is a necessity of controlling the temperature more positively.

In accordance with this embodiment of the present invention, to meet this and to control the surface temperature more precisely, a vacuum heat insulating material 34 is adhered to the surface of the linear motor 32 to provide heat insulation. In addition to this, a planar heater 35 is adhered onto the vacuum insulating material 34 for the temperature control thereof. On the surface of the heater 35, which is close to the optical axis 36a, a temperature sensor 37 is adhered to measure the surface temperature of the heater, to thereby adjust the amount of electrical voltage to be applied to the heater 35. With this arrangement, as regards the linear motor surface, the surface temperature at least around the interferometer optical axis can be controlled very precisely, and influence on the measurement error can be removed substantially completely. Denoted at 36 is a mirror, which provides a position reference for the position measurement (distance measurement) through the interferometer 36.

Embodiment 3

Figure 4:
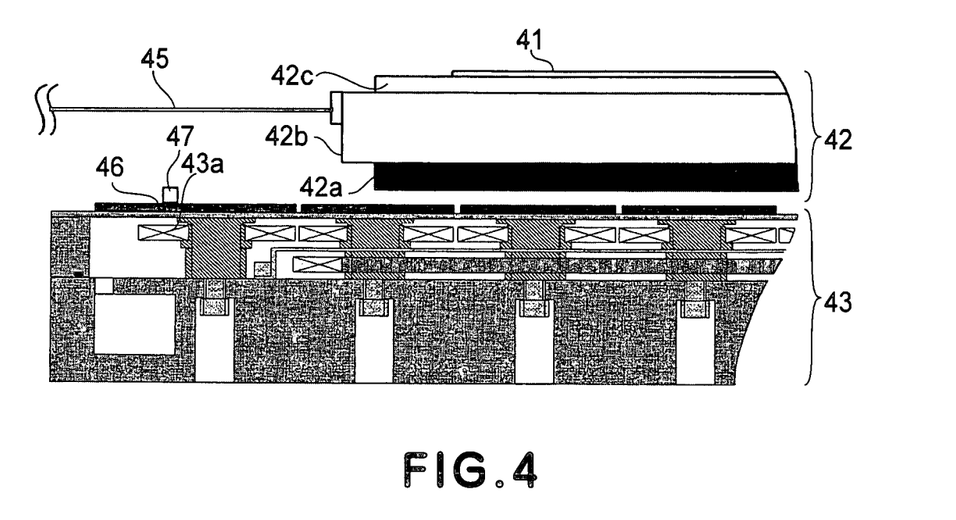
FIG. 4 is a fragmentary and sectional view of a positioning system according to a third embodiment of the present invention.

Next, a third embodiment of the present invention will be described with reference to FIG. 4. FIG. 4 shows an example wherein the present invention is applied to a plane motor, that is, a linear motor structure having simultaneous drivability with respect to two or more axial directions. Here, a plane motor, as disclosed in Japanese Laid-Open Patent Application, Publication No. 2004-254489, is taken as an example.

FIG. 4 illustrates a sectional view of a plane motor, with a portion being omitted. A wafer 42, which is the object to be positioned, is supported on a movable element 42 that comprises two-dimensionally arrayed magnet groups 42a, a top plate 42b above the magnet groups, and a chuck 42c. A stator 43 is disposed opposed to the movable member 42 and it comprises a plurality of elongated coils 43a corresponding to the magnet groups 42a. Each coil 43a has a dual-layer structure, for example, comprising a first coil layer extending in the X direction and a second coil layer extending in the Y direction. With this structure, the linear motor can be driven in at least two axial directions of X and Y. By modifying the magnet-array structure appropriately, the linear motor can be driven in six axial directions, that is, X, Y, Z, θx, θy and θz. In other words, the movable element 42 can be controlled with respect to the six-axis directions on the basis of a Lorentz force, completely, without any other guide.

In the plane motor (42, 43), which itself is conventional, for collection of heat from coils, there is a jacket structure having a cooling medium flowpassage formed to ensure that a cooling medium (pure water or inactive cooling medium) directly contacts the coils. Even in such a structure, a temperature difference will be produced between the upstream side and the downstream side of the cooling medium flow. Furthermore, since the movable element 42 moves two-dimensionally relative to the stator 43, depending on the coil structure, there is a possibility that a distribution is produced not only in the upstream-to-downstream direction, but also in a direction orthogonal to it. In addition to this, in the case of plane motors, structurally, the surface of the stator extends throughout the entire movable range of the movable element, and the interspace between the interferometer optical axis 45 and the stator 43 surface is short, as compared with other structures. In this sense, the interferometer optical axis 45 is easily susceptible to the influence of temperature distribution at the stator 43 surface.

In accordance with this embodiment of the present invention, in consideration of it, a film heater 46 is adhered to the surface of the stator 43, thereby to suppress a change, or the like, of the surface temperature thereof. In some structures, it may be necessary to divide the film heater 46 into separate pieces and to adhere them as to avoid a distribution upon the stator surface. Although, in this example, these are explained as being arrayed in a one-dimensional direction (horizontal direction in the drawing), this is merely for the convenience of explanation. Practically, the film heater may preferably be divided two-dimensionally in accordance with the requirements. Furthermore, a temperature sensor 47 may be provided as in the first and second embodiments.

As described above, a film-like heater is adhered to the surface of the linear motor stator, for temperature adjustment of the same, by which fluctuation of air around the optical axis of the interferometer disposed nearby can be reduced much more without a decrease of the motor efficiency. Therefore, position measurement error can be reduced, and the positioning precision can be improved significantly.

Embodiment 4

Figure 5:
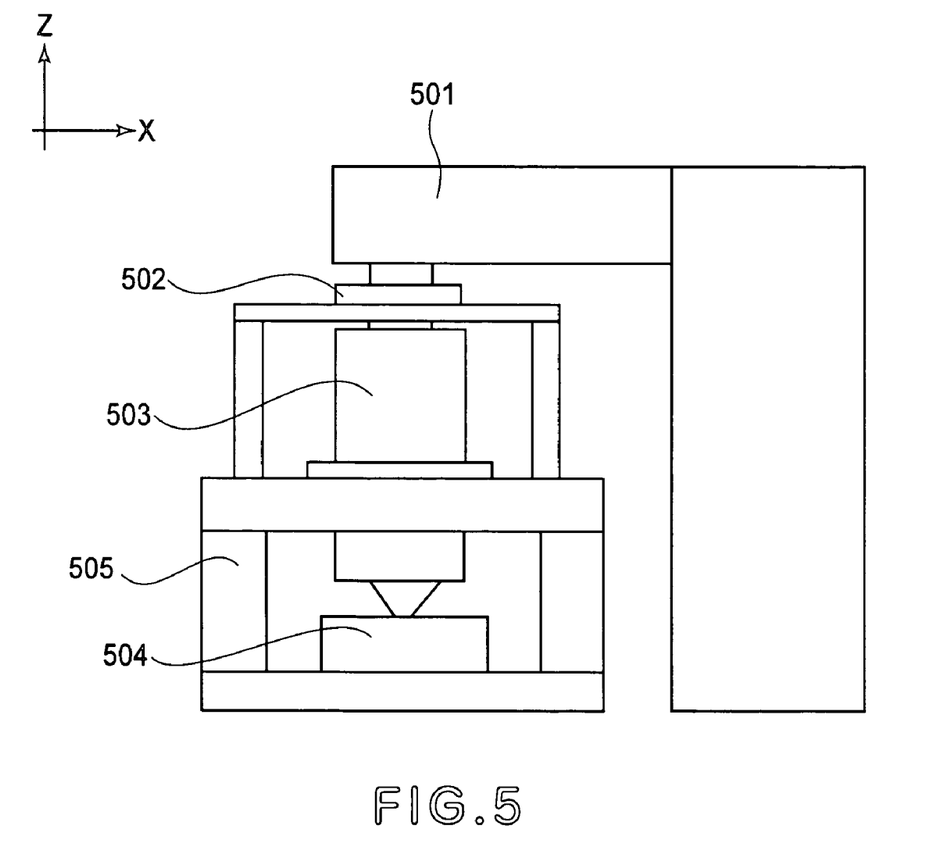
FIG. 5 is a schematic view of an exposure apparatus in which a positioning system according to the present invention is incorporated.

Next, an example of an exposure apparatus in which a positioning system according to the present invention is incorporated will be explained. As shown in FIG. 5, the exposure apparatus comprises an illumination system 501, a reticle stage 502, on which a reticle (not shown) is mounted, a projection optical system 503, and a wafer stage 504 on which a wafer (not shown) is mounted. This exposure apparatus is configured to transfer a circuit pattern formed on the reticle onto the wafer through projection exposure, and it may be based on either a step-and-repeat projection exposure method or a step-and-scan projection exposure method.

The illumination system 501 illuminates a reticle having a circuit pattern formed thereon. It includes a light source unit and an illumination optical system. The light source unit may comprise a laser, for example, as a light source. As regards the laser, an ArF excimer laser having a wavelength of about 193 nm, a KrF excimer laser having a wavelength of about 248 nm, or an $F_2$ excimer laser having a wavelength of about 153 nm may be used. However, the laser is not limited to excimer lasers, and a YAG laser may be used, for example. Furthermore, the number of lasers is not limited.

When a laser is used as a light source, a beam shaping optical system for shaping parallel light from the laser light source into a desired beam shape, and an incoherent-transforming optical system, for transforming a coherent laser light beam into incoherent light, may preferably be used. The light source to be used in the light source unit is not limited to lasers. One or more lamps, such as Hg lamps or Xe lamps, may be used.

The illumination optical system is an optical system for illuminating the mask, and it may comprise a lens, a mirror, a light integrator, and a stop, for example. The projection optical system 503 may comprise one of an optical system consisting only of a plurality of lens elements, an optical system (catadioptric optical system) having a plurality of lens elements and at least one concave mirror, an optical system having a plurality of lens elements and at least one diffractive optical element, such as a Kinoform, and an all-mirror type optical system, for example.

Embodiment 5

The exposure apparatus, such as described above, can be used for the manufacture of microdevices, such as semiconductor devices (e.g., semiconductor integrated circuits), micromachines, and thin-film magnetic heads, for example, having a very fine pattern.

Next, an embodiment of a device manufacturing method, which uses an exposure apparatus such as described above, will be explained.

Figure 6:
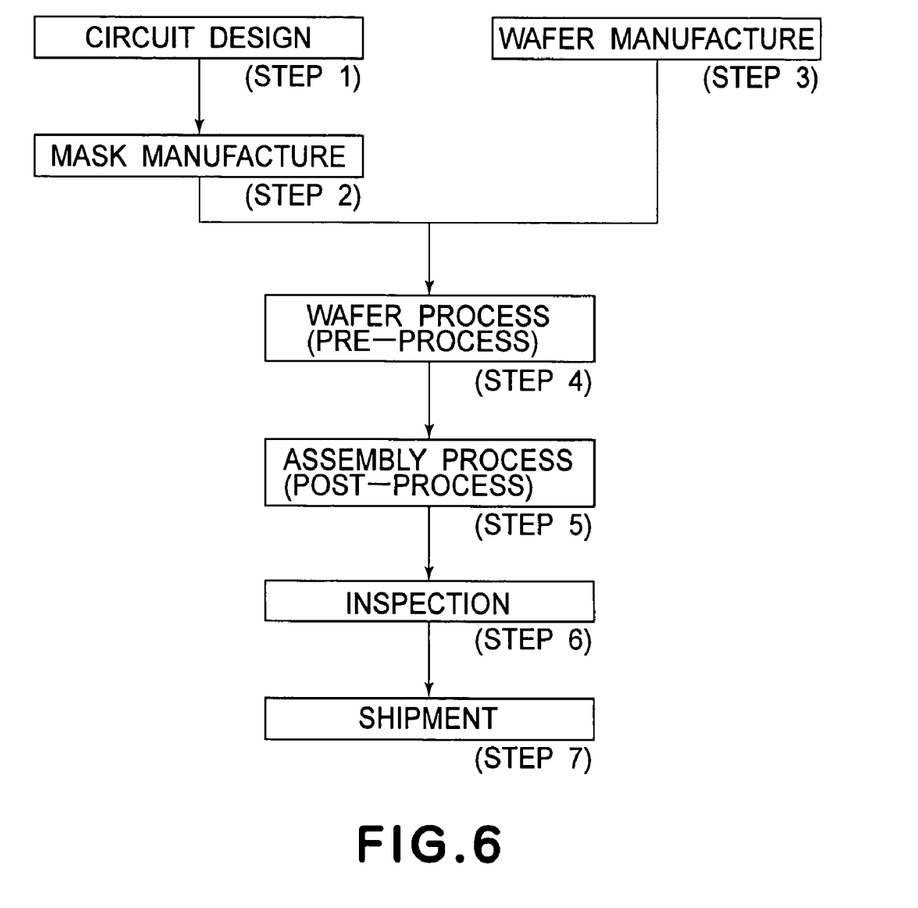
FIG. 6 is a flow chart for explaining device manufacturing processes.

FIG. 6 is a flow chart for explaining the overall procedure for semiconductor manufacture. Step 1 is a design process for designing a circuit of a semiconductor device. Step 2 is a process for making a mask on the basis of the circuit pattern design.

On the other hand, Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and finally, they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A positioning system comprising:
a stage configured to move while carrying an object thereon;
an interferometer configured to measure a position of said stage;
a driving unit configured to drive said stage;
a heater provided between a light path of said interferometer and a coil which is a component element of said driving unit; and
a cooling jacket configured to cover said coil and to circulate a cooling medium therein,
wherein said heater is provided on a surface of said cooling jacket.

2. A positioning system according to claim 1, wherein said heater is disposed on said cooling jacket through one of a resin material and a vacuum insulating material.

3. A positioning system according to claim 1, wherein the cooling medium is set at a temperature lower than a temperature of air around the light path.

4. A positioning system according to claim 1, further comprising a temperature sensor for measuring a surface temperature of said cooling jacket, and a controller for controlling an amount of heat generation of said heater on the basis of an output of said temperature sensor.

5. A positioning system according to claim 1, wherein said heater has a film-like shape.

6. A positioning system according to claim 1, wherein said heater comprises a plurality of heater elements which are configured so that an amount of heat generation of each of said heating elements is controlled independently.

7. A positioning system according to claim 1, wherein said heater is provided between a movable element and a stator of said driving unit.

8. A positioning system according to claim 1, wherein said heater is configured to generate heat in response to application of an electrical voltage to an electrically conductive material which constitutes at least a portion of said cooling jacket.

9. A positioning system according to claim 1, further comprising a drive control unit configured to control a drive of said driving unit, and a computing unit configured to predict a change in temperature of the cooling medium on the basis of an output of said drive control unit, wherein an amount of heat generation of said heater is controlled on the basis of an output of said computing unit.

10. A positioning system according to claim 1, wherein said driving unit comprises a plane motor.

11. An exposure apparatus comprising:
a positioning system configured to position at least one of an original and a substrate,
wherein said positioning system includes (i) a stage configured to move while carrying an object thereon, (ii) an interferometer configured to measure a position of said stage, (iii) a driving unit configured to drive said stage, (iv) a heater provided between a light path of said interferometer and a coil which is a component element of said driving unit, and (v) a cooling jacket configured to cover said coil and to circulate a cooling medium therein, wherein said heater is provided on a surface of said cooling jacket.

12. A device manufacturing method comprising:
(a) exposing a substrate by use of an exposure apparatus; and
(b) developing the exposed substrate,
wherein the exposure apparatus has a positioning system configured to position the substrate,
wherein the positioning system includes (i) a stage configured to move while carrying an object thereon, (ii) an interferometer configured to measure a position of the stage, (iii) a driving unit configured to drive the stage, (iv) a heater provided between a light path of the interferometer and a coil which is a component element of the driving unit, and (v) a cooling jacket configured to cover the coil and to circulate a cooling medium therein, wherein the heater is provided on a surface of the cooling jacket.

* * * * *